United States Patent
DiJaili et al.

(10) Patent No.: US 6,847,054 B1
(45) Date of Patent: Jan. 25, 2005

(54) OPTICAL TRANSISTOR AND METHOD THEREOF

(75) Inventors: Sol P. DiJaili, Moraga, CA (US); Jeffrey D. Walker, El Cerrito, CA (US)

(73) Assignee: Finisar Corporation, Sunnyvale, CA (US)

(*) Notice: Subject to any disclaimer, the term of this patent is extended or adjusted under 35 U.S.C. 154(b) by 188 days.

(21) Appl. No.: 10/072,263

(22) Filed: Feb. 7, 2002

(51) Int. Cl.[7] ............................................... H01L 29/16
(52) U.S. Cl. ........................ 257/83; 257/432; 257/462; 257/198; 257/186
(58) Field of Search ........................... 257/432, 462, 257/197, 198, 187, 186, 83, 84

(56) References Cited

U.S. PATENT DOCUMENTS

| | | | |
|---|---|---|---|
| 5,748,653 A | | 5/1998 | Parker et al. |
| 5,821,571 A | | 10/1998 | Lebby et al. |
| 5,892,786 A | * | 4/1999 | Lott .............................. 372/50 |
| 5,946,438 A | * | 8/1999 | Minot et al. ................... 385/88 |
| 6,236,671 B1 | * | 5/2001 | Babic ........................... 372/50 |
| 6,331,990 B1 | | 12/2001 | Parker et al. |
| 6,445,495 B1 | | 9/2002 | Walker et al. |
| 6,479,844 B2 | * | 11/2002 | Taylor .......................... 257/192 |
| 6,538,808 B1 | | 3/2003 | Tastavridis |

* cited by examiner

*Primary Examiner*—Nathan J. Flynn
*Assistant Examiner*—Pershelle Greene
(74) *Attorney, Agent, or Firm*—Workman Nydegger

(57) ABSTRACT

An optical transistor is disclosed that provides a fast switching time, an amplified gain, and isolation. The optical transistor receives a small optical input signal at an optical base port, generates an amplified replica at an optical emitter port, and generates an inverted replica on a vertical light at an collector port. One embodiment of the optical transistor is implemented with a vertical lasing semiconductor optical amplifiers (VLSOA), wherein the ballast light is used a signal for the collector port.

11 Claims, 7 Drawing Sheets

US 6,847,054 B1

OPTICAL TRANSISTOR AND METHOD THEREOF

BACKGROUND INFORMATION

1. Field of the Invention

The present invention relates generally to the field of optics, and more particularly to optical switches.

2. Description of Related Art

A transistor in the traditional sense has three electrical contacts for use as a switch, amplifier, or detector. The recent explosion in optical technologies for transferring information at light speed is resulting in a shift from electrical-centric networks to all-optical networks. Conventional wisdom dictates that the use of electrical transistors for switching in a system design is due to the historical belief that electrons and holes are more suitable to attain faster switching times than photons.

FIG. 1 is a prior art circuit diagram illustrating a Bipolar Junction Transistor (BJT) transistor 10. The electrical transistor 10 is constructed with three terminals, a base B 11a, an emitter E 12a, and a collector C 13a. The base B 11a serves as an input, while the emitter E 12a serves as a first output and the collector C 13a serves as a second output. Operationally, the electrical transistor 10 receives a small current that is applied to the base, represented by the symbol $I_B$ 11b with a positive phase 11c, which generates a first amplified replica of $I_B$ 11b as an emitter current with a positive phase 12c, $I_E$, and generates a second amplified and inverted replica of $I_B$ 11b as a collector current with negative phase 13c, $I_C$. A biased voltage Vcc 14 is typically placed at the collector terminal 13a, and a ground is typically placed at the emitter terminal 12a.

Three defining characteristics make up the essential operations of the electrical transistor 10. The electrical transistor 10 produces a gain between an input and output. The change in the collector current $I_C$ 13b and the emitter current $I_E$ 12b are significantly greater than change in the base current $I_B$ 11b. This mathematical relationship can be represented by the equation, $\Delta I_C = \Delta I_B$, where $\beta$ is typically a value between 20 to 100. Gain enables cascading large number of devices. Secondly, the electrical transistor 10 can switch fully ON or fully OFF, enabling the capability to design digital gates, e.g. NAND, AND, NOT, OR, and XOR. Thirdly, there exists an isolation in the electrical transistor 10 that produces an unidirectional signal flow. Unidirectionality means that the change in the collector current in response to applying an electrical current to the base occurs in such logical sequence, but not vice versa. For example, in the forward active mode where voltage is applied to the collector 13a, this results in little corresponding change in the characteristics of the base 11a. Therefore, the signal flow in the electrical transistor 10 is unidirectional, which flows only from the base 11a to the collector 13a, and not from the collector 13a to the base 11a.

The isolation characteristic, in addition to the other two characteristics of gain and switching, are the essential features that enables the electronics chip industry to design and manufacture Very Large Scale Integrated (VLSI) circuits with millions of transistors. In designing a VLSI chip, the architecture is sub-divided into small linear sub-units or steps. Each subunit is built, analyzed, and tested separately as a unit. The sub-units then are pieced together as one large complex system. The underlying principle that enables a VLSI design is unidirectionality of signal flow. If the signal flow is bi-directional, when two sub-units are constructed in series, the entire system would require a complete re-analysis to test the functionalities of the system. Even though each sub-unit behaves as a single unit, multiple sub-units connected together as a large complex system do not operate as a single, easily predictable unit. If gain is present in the bi-directional subunits, then multi-state, and even oscillatory behavior with no functionally well-defined input or output may likely result. The bi-directionality of a large complex system hinders the ability to predict the performance based on single unit characteristics. Therefore, the unidirectional isolation characteristic of the electrical transistor 10 is a key-enabling feature that allows massive integration of transistors on a chip. The gain and switching feature allows for wide distribution and robust restoration of a signal while minimizing the effects of noise in the system. Prior research and development in the design of an optical transistor have resulted in slow switching time, a bulky device, and/or impractical implementation.

U.S. Pat. No. 5,748,653 discloses a device that possesses both elements for gain and switching. However, there are no means identified, implicitly or explicitly, for unidirectional signal flow. Care must be taken in this area since the performance of the device in an optical circuit will depend on the amount of isolation or unidirectional signal flow. If there is not enough isolation present, then unwanted oscillations and spurious behavior will result. Furthermore, the device with the stated amplifier disclosed in U.S. Pat. No. 5,748,653 is not linear or gain stabilized. Linear gain is an attractive feature if the device is operated in analog mode (i.e. output is not completely on or completely off but operated at an intermediate level) and a high fidelity output replica of the input is needed.

Accordingly, there is a need to have an optical transistor with fast switching time that is comparable or better than the switching time of an electrical transistor, possesses a definite means of isolation, and possesses linear gain if used in analog mode.

SUMMARY OF THE INVENTION

The present invention discloses an optical transistor that provides a fast switching time, an amplified gain, and unidirectional signal flow isolation. The optical transistor receives a small optical input signal at an optical base port, generates an amplified replica at an optical emitter port, and generates a phase inverted replica at an optical collector port. One embodiment of the optical transistor is implemented with a vertical lasing semiconductor optical amplifier (VLSOA), wherein the ballast light is used as a signal for the collector port. The optical collector port can also be represented by an orthogonally polarized or wavelength shifted optical beam that is collinearly propagating with the amplified signal. Further, the optical collector port can be in the plane of the wafer and be orthogonally or obliquely propagating with respect to the amplified beam.

Advantageously, the present invention enables the design of an all-optical system with optical transistors, instead of electrical transistors. Furthermore, the present invention provides an optical transistor that can operate as an amplifier, a switch, or a detector.

Other structures and methods are disclosed in the detailed description below. This summary does not purport to define the invention. The invention is defined by the claims.

DETAILED DESCRIPTION OF THE PREFERRED EMBODIMENT(S)

An apparatus and method for designing an optical transistor is described. In the following description, for purposes of explanation, numerous specific details are set forth in order to provide a thorough understanding of the present invention. It will be evident, however, to one skilled in the art that the present invention may be practiced without these specific details. For example, a parallel analogy can be drawn between an electrical transistor and an optical transistor. Consequently, all circuits using electrical-based transistors that are biased in the forward active mode can be substituted with optical transistors as described in the present invention. More particularly, wherever an electrical transistor is placed, one can literally place an optical transistor, and obtains all the functionalities of electronics with optics.

Figure 1:
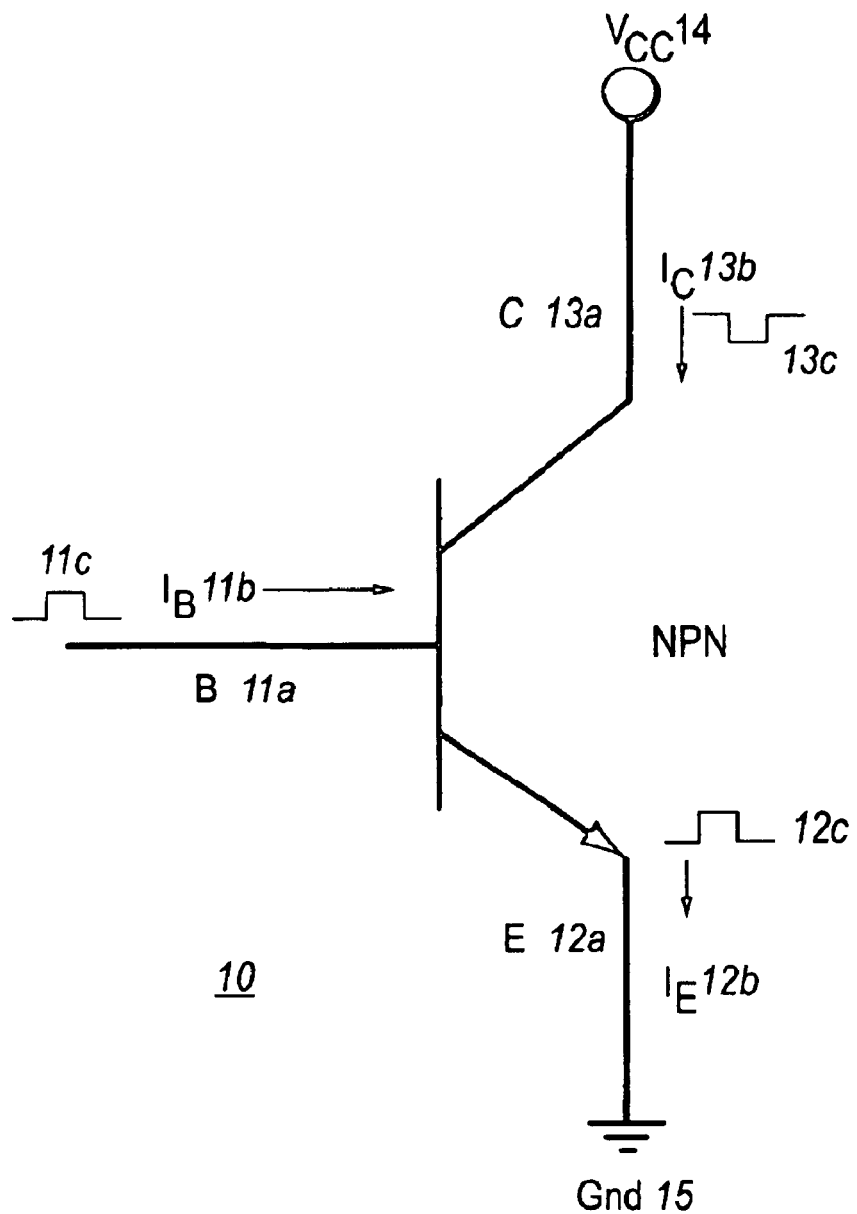
FIG. 1 is a prior art circuit diagram illustrating a Bipolar Junction Transistor (BJT) transistor.
Figure 2:
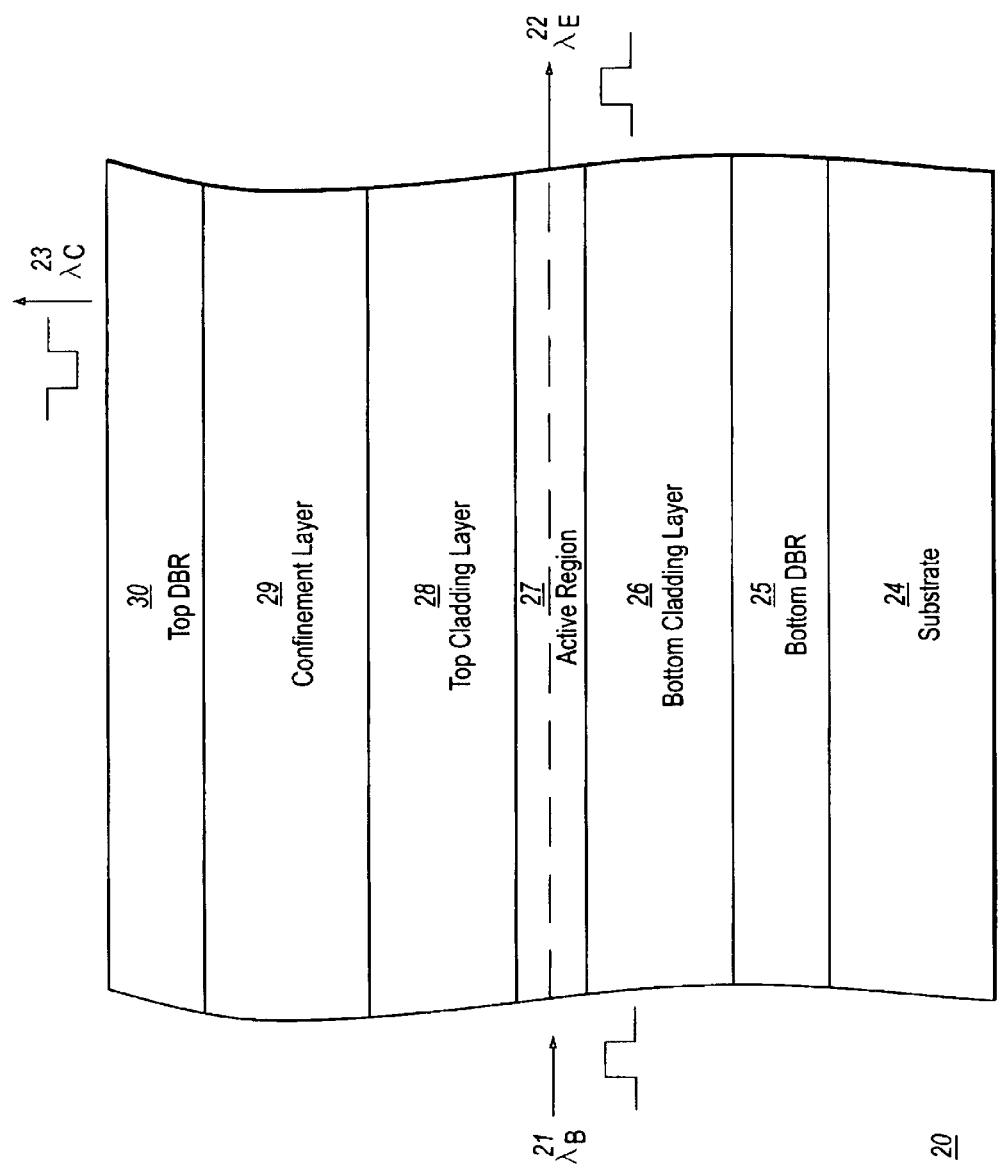
FIG. 2A is a process diagram illustrating an optical transistor (OT) in accordance with the present invention.
FIG. 2B is a symbol representation of an optical transistor (OT) in accordance with the present invention.

FIG. 2A is a process diagram illustrating an optical transistor (OT) 20 with a top Distributed Bragg Reflector (DBR) 30, a bottom DBR 25, and an active region 27 for producing gain or an amplified signal. A complete process structure of the optical transistor 20 starts with a substrate 24 as a foundational layer, the bottom DBR 25 overlaying the substrate 24, a bottom cladding layer 26 overlaying the bottom DBR 25, an active region 27 overlaying the bottom cladding layer 26, a top cladding layer 28 overlaying the active region 27, a confinement layer 29 overlaying the top cladding layer 28, and the top DBR 30 overlaying the confinement layer 29.

A small optical input signal, $\lambda_B$ 21, is injected horizontally to generate an amplified replica at a first output, $\lambda_E$ 22, and generate an amplified inverted replica on the vertical light, a VCSEL (Vertical Cavity Surface Emitting Laser) light, at a second output $\lambda_C$ 23. The gain in the optical transistor 20 is produced because the change in optical power of $\lambda_C$ 23 is significantly larger than the input power of the optical light $\lambda_B$ 21. Gain is produced because in part the VLSOA device and resulting gain length is long (for example, 100's of um) 20. A collector VCSEL port for generating the second output $\lambda_C$ 23 is located toward the emitter end or port, which generates the first output $\lambda_E$ 22. The input base signal, $\lambda_B$ 21, is amplified along the length (for example, 10 to 1000× or more). This amplified signal competes for light with the collector VCSEL. The optical transistor 20 has a fast switching capability to turn the VCSEL light ON and OFF due to the use of the stimulated emission. Stimulated emission provides a fast process to switch laser light.

Preferably, the optical transistor 20 is capable of fully switching on and off, enabling digital circuits. The device has a threshold input optical power)$\lambda_B$ 21 at the base below which the collector is fully ON (the collector signal is high enough to turn OFF the collector on a trailing device), and a second higher threshold input optical power above which the collector is fully OFF (collector signal is low enough to turn ON the collector of trailing device). For example, a VLSOA device can be designed such that for base signal<110 $\mu$W, the collector signal is >1000 $\mu$W, and for base signal>100 $\mu$W, the collector signal is <10 $\mu$W. If collector signals of two such devices are combined and input into the base of a third device, the logical AND operation is performed. Furthermore, in this example, the AND operation is successfully completed even with 10 dB of optical loss (10 dB loss=90% loss) between the collector outputs of the first stage, and the base input of the second stage, thereby enabling practical implementation. Device threshold conditions can be identical throughout entire circuit, or device threshold conditions can be varied to create multi-level logic circuits by adjusting device length or other parameters. Also, the input threshold of the logical gate can be set by arranging the optical transistors in a regenerative circuit design where each of the collector outputs of two optical transistors are fed back to the opposing inputs of the two transistors. This leads to a circuit where there are two bistable states that are regeneratively determined. The gains and losses in the regenerative circuit can be adjusted to set the input threshold to a particular level.

The optical transistor 20 also provides isolation between the $\lambda_C$ 23 and the $\lambda_B$ 21. On the one hand, an input signal flows from the base to the collector. On the other hand, if an optical signal is injected into the collector, this would give rise to a small delta change in ASE (amplified spontaneous emission) that gets propagated back. The change in the backward propagating ASE is in contrast to the stimulated emission of the forward propagating signal which is much larger in optical power. In the forward propagation, the optical transistor 20 can attain nearly 20 dB gain. When operating in reverse propagation, where a possible delta ASE modulation is in the reverse direction, the isolation is approximately in the order of 40 dB, which provides a superior isolation, possibly even more than that of an electrical transistor. The optical transistor 20 uses the orthogonality of space, where the input light propagates horizontally, and a vertical light to the output collector propagates vertically. The vertical signal and the horizontal signal do not mix optically except for ASE modulation.

To further enhance the isolation or unidirectional signal flow, minimize the reverse propagation ASE modulation, and avoid the possibility of injection locking a second or multiple optical transistor outputs, whose outputs are connected to the first optical transistor, several methods maybe employed. The VCSEL in the optical transistor maybe designed to operate in a single mode with one wavelength. In order to obtain enough power over a large VCSEL area and still stay in a single mode, a Fresnel lens or other diffractive or refractive optics maybe employed to select one mode. If the output of other optical transistors are to be connected together in a way that there maybe coupling from one VCSEL to another, then a different wavelength maybe selected for each such that the wavelengths are sufficiently out of the injection locking bandwidth or the transmission bandwidth of the VCSEL passband (i.e. the passband of the dry Fabry-Perot cavity resonance of the VCSEL). The wavelength of the VCSELs outputs of the other optical transistors maybe chosen by selecting either a slightly different cavity length or using a different transverse mode of the VCSEL structure. If the VCSEL in the optical transistor is multi-transverse mode, the cavity lengths or transverse mode structure again maybe chosen such that the resonant wavelengths of the various outputs do not overlap and injection locking and ASE modulation is avoided. Differing optical polarization states and/or non-reciprocal optical elements (isolators, circulators, Faraday rotation devices) maybe employed internally or externally to enhance or altogether provide for the isolation.

Figure 2B:
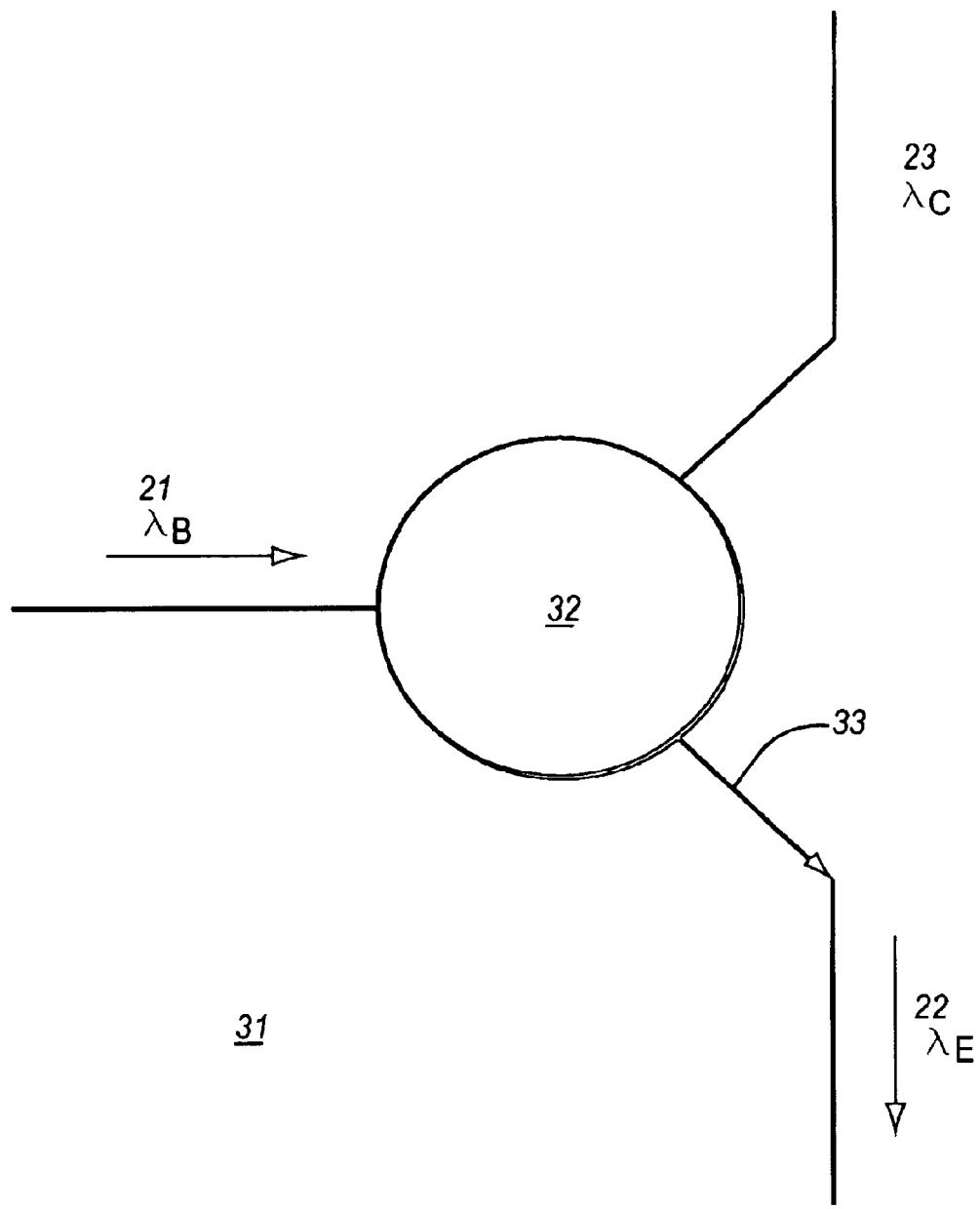

FIG. 2B is a symbol representation of an optical transistor 31 with the optical input signal, or optical base $\lambda_B$ 21, an amplified replica at the first output, or optical emitter $\lambda_E$ 22, and generates the amplified inverted replica on the vertical light, a VCSEL light, at a second output, or optical collector $\lambda_C$ 33. The optical collector $\lambda_C$ 33 is where the VCSEL light emanates. A circle 32 represents that it is optical, and an arrow 33 represents the intended amplifier gain direction.

Figure 3:
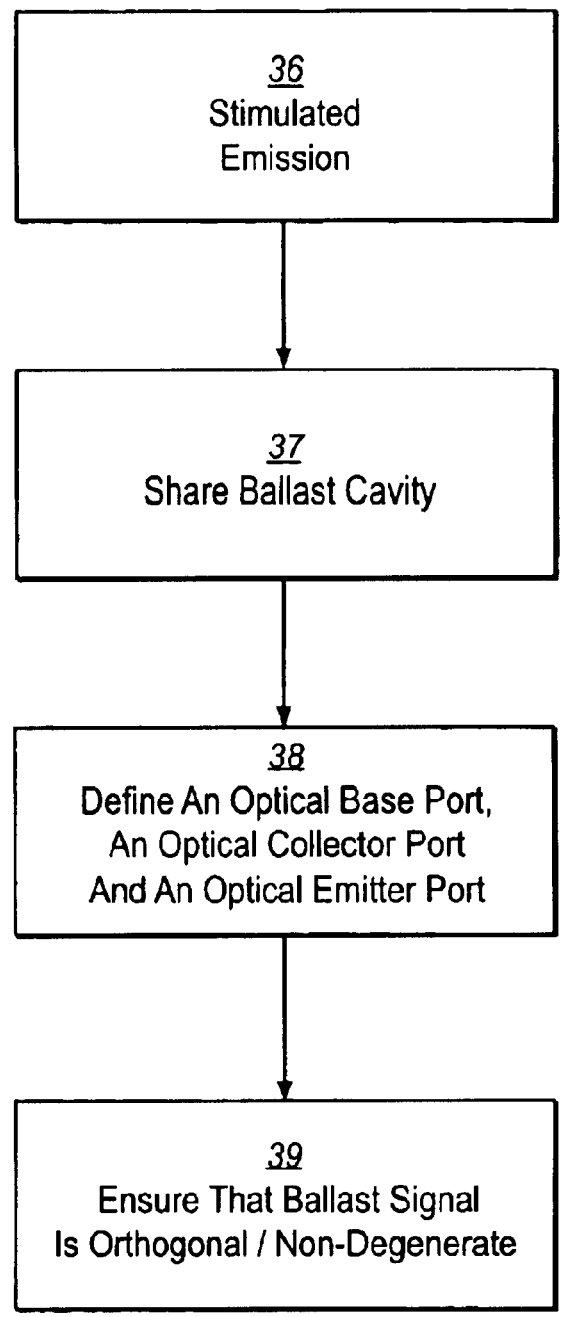
FIG. 3 is a flow chart illustrating the functional process for operating an optical transistor in accordance with the present invention.

FIG. 3 is a flow chart illustrating the functional process 35 for operating the optical transistor 20. At step 36, the process 35 generates a stimulated emission to provide gain, by taking a small signal and generating a large signal, analogous to the large diffusion current created in the N-P-N junctions of the electrical transistor that gives gain. At step 37, the optical transistor structure 20 does not have to be orthogonal, but builds an optical cavity around the same stimulated emission that is shared with the signal light. The process 35 builds an optical cavity around the same gain medium, and creates a ballast laser that is above threshold. The process 35 shares the stimulated emission with a ballast laser cavity. At step 38, the process 35 defines optical ports including an optical base port, an optical collector port, and an optical emitter ports. At step 39, the process 35 provides that the ballast laser cavity is orthogonal and obtains isolation of the ports to ensure that the ballast laser cavity is orthogonal or non-degenerate in some optical parameters (wavelength, polarization, propagation direction, or other non-reciprocal elements or materials etc.). The switching comes about when the injected input is amplified and the shared laser, created by the ballast cavity shuts off. The ballast laser provides stimulated emission. The stimulated emission could also be provided by the amplified signal so that there is essentially stimulated emission all the time and thus the optical transistor can operate as a fast switch. The gain for the injected signal is also attained from the stimulated emission, while isolation is attained by non-degenerate optical parameters (e.g. wavelength, polarization, propagation direction, non-reciprocal elements or materials).

The optical transistor 20 described above, in which a vertical light no longer serves purely as a ballast light to linearize or stabilize the gain of the horizontal optical amplifier, now uses the vertical light as an output signal. The use of the ballast light produces gain, switching, and, with techniques described above, provides isolation. These are characteristics that define a transistor.

Figure 4A:
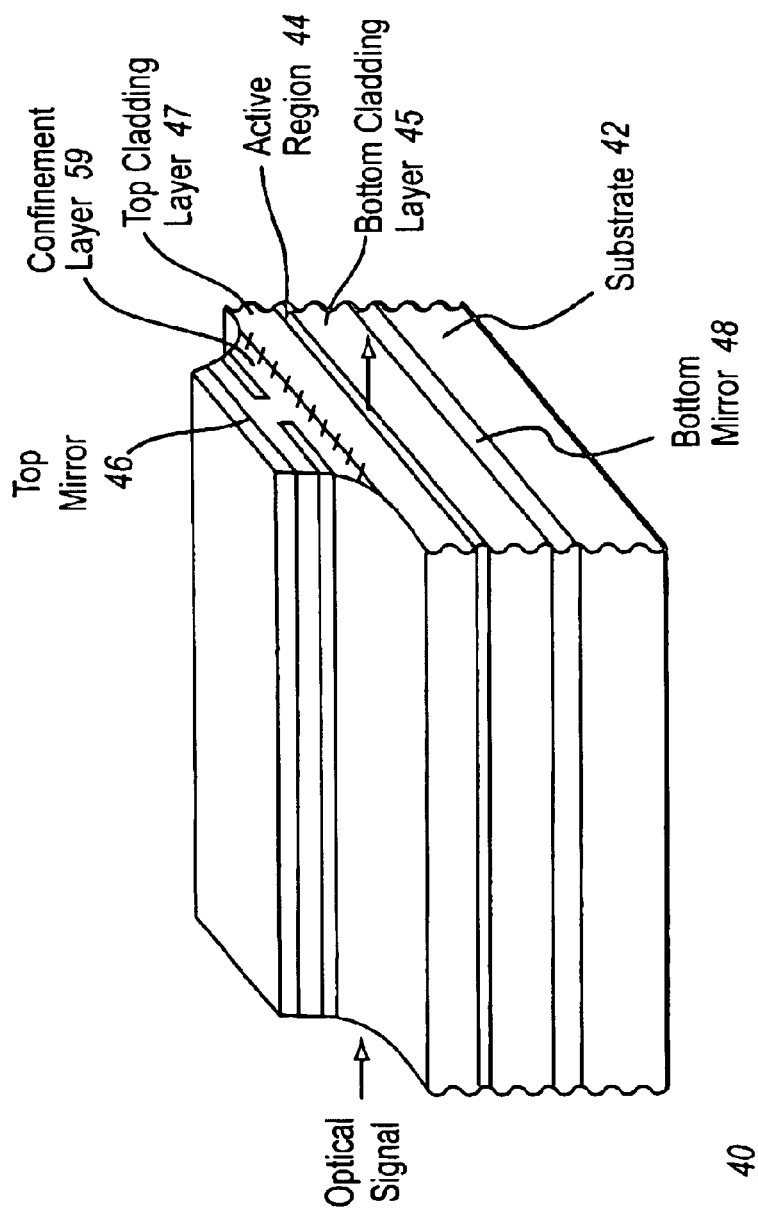
FIGS. 4A–4C are a perspective view, transverse cross-section, and longitudinal cross-section, respectively, of one embodiment of a vertical lasing semiconductor optical amplifier (VLSOA) in according to the present invention.
Figure 4B:
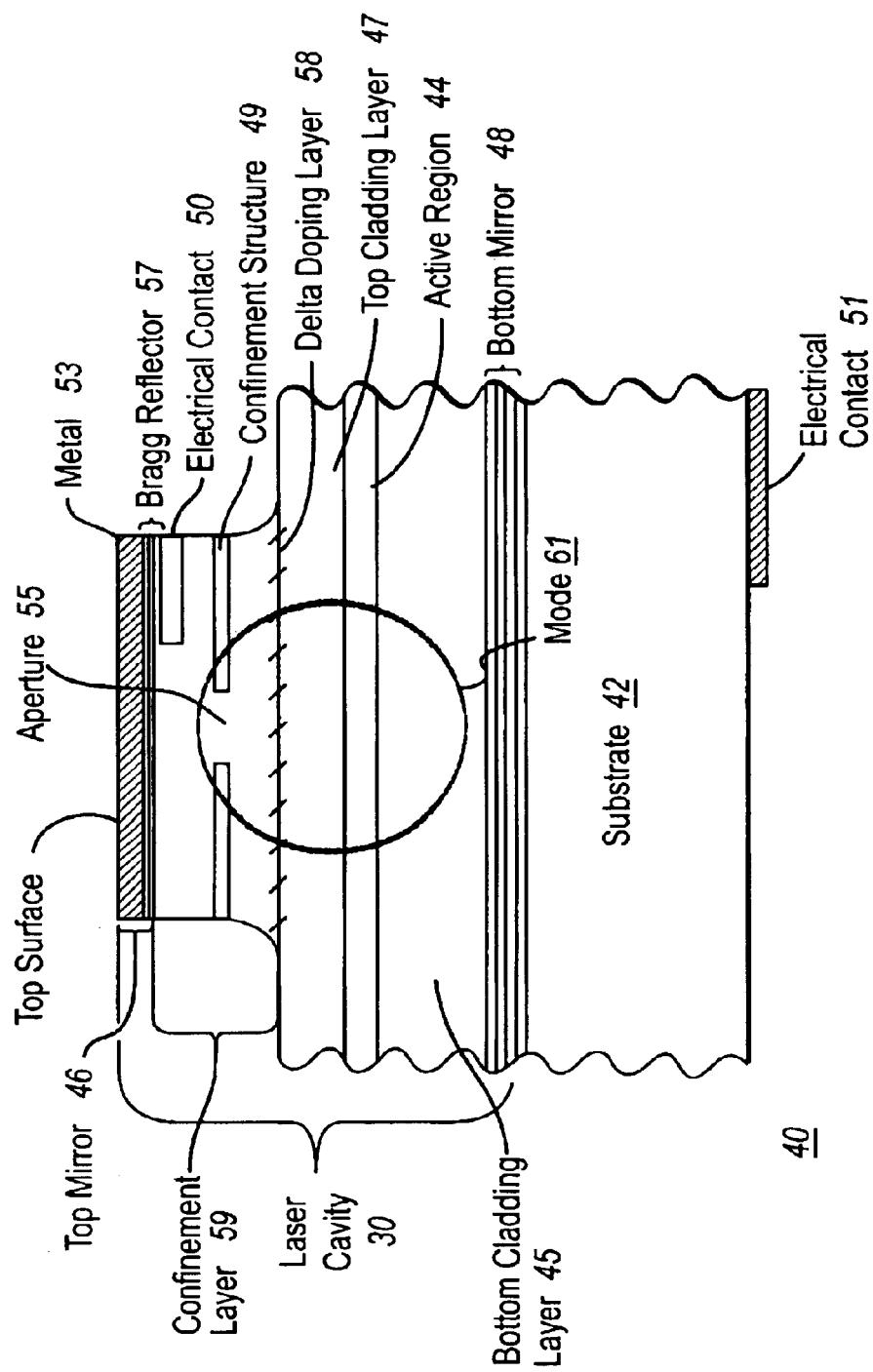
Figure 4C:
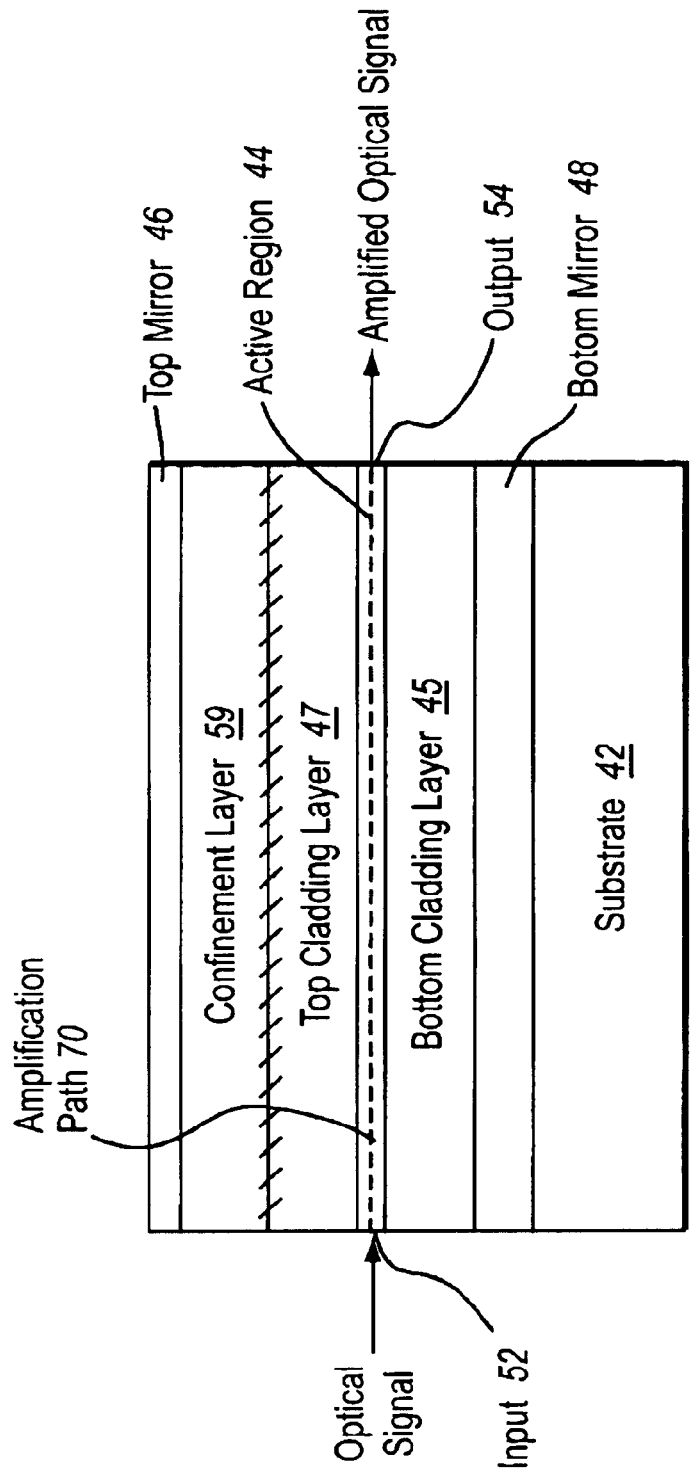

FIGS. 4A–4C are a perspective view, transverse cross-section, and longitudinal cross-section, respectively, of one embodiment of a VLSOA 40 according to the present invention, with FIG. 4B showing the most detail.

Referring to FIG. 4B and working from bottom to top in the vertical direction (i.e., working away from the substrate 42), VLSOA 40 includes a bottom mirror 48, bottom cladding layer 45, active region 44, top cladding layer 47, confinement layer 49, and a top mirror 46. The bottom cladding layer 45, active region 44, top cladding layer 47, and confinement layer 59 are in electrical contact with each other and may be in direct physical contact as well. An optional delta doping layer 58 is located between the top cladding layer 47 and confinement layer 59. The confinement layer 59 includes a confinement structure 49, which forms aperture 55. The VLSOA 40 also includes an electrical contact 50 located above the confinement structure 49, and a second electrical contact 51 formed on the bottom side of substrate 42.

VLSOA 40 is a vertical lasing semiconductor optical amplifier since the laser cavity 80 is a vertical laser cavity. That is, it is oriented vertically with respect to the amplifying path 70 and substrate 42. The VLSOA 40 preferably is long in the longitudinal direction, allowing for a long amplifying path 70 and, therefore, more amplification. The entire VLSOA 40 is an integral structure formed on a single substrate 42 and may be integrated with other optical elements. In most cases, optical elements which are coupled directly to VLSOA 40 will be coupled to the amplifying path 70 within the VLSOA. Depending on the manner of integration, the optical input 52 and output 54 may not exist as a distinct structure or facet but may simply be the boundary between the VLSOA 40 and other optical elements. Furthermore, although this disclosure discusses the VLSOA 40 primarily as a single device, the teachings herein apply equally to arrays of devices.

VLSOA 40 is built from a series of layers, allowing the VLSOA 40 to be fabricated using standard semiconductor fabrication techniques, preferably including organo-metallic vapor phase epitaxy (OMVPE) or organometallic chemical vapor deposition (OMCVD). Other common fabrication techniques include molecular beam epitaxy (MBE), liquid phase epitaxy (LPE), photolithography, e-beam evaporation, sputter deposition, wet and dry etching, wafer bonding, ion implantation, wet oxidation, and rapid thermal annealing, among others.

The optical signal amplified by the VLSOA 40 is confined in the vertical direction by index differences between bottom cladding 45, active region 44, and top cladding 47, and to a lesser extent by index differences between the substrate 42, bottom mirror 48, confinement layer 50, and top mirror 46. Specifically, active region 44 has the higher index and therefore acts as a waveguide core with respect to cladding layers 45 and 47. The optical signal is confined in the transverse direction by index differences between the confinement structure 49 and the resulting aperture 55. Specifically, aperture 55 has a higher index of refraction than confinement structure 49. As a result, the mode of the optical signal to be amplified is generally concentrated in dashed region 61. The amplifying path 70 is through the active region 44 in the direction in/out of the plane of the paper with respect to FIG. 4B.

The choice of materials system will depend in part on the wavelength of the optical signal to be amplified, which in turn will depend on the application. Wavelengths in the approximately 1.3–1.6 micron region are currently preferred for telecommunications applications, due to the spectral properties of optical fibers. The approximately 1.28–1.35 micron region is currently also preferred for data communications over single mode fiber, with the approximately 0.8–1.1 micron region being an alternate wavelength region. The term "optical" is meant to include all of these wavelength regions. In a preferred embodiment, the VLSOA 40 is optimized for the 1.55 micron window.

The electrical contacts 50 and 51 are metals that form an ohmic contact with the semiconductor material. Commonly used metals include titanium, platinum, nickel, germanium, gold, palladium, and aluminum. In this embodiment, the laser cavity is electrically pumped by injecting a pump current via the electrical contacts 50 and 51 into the active region 44. In particular, contact 50 is a p-type contact to inject holes into active region 44, and contact 51 is an n-type contact to inject electrons into active region 44. Contact 40 is located above the semiconductor structure (i.e., above confinement layer 59 and the semiconductor part of Bragg reflector 57, if any) and below the dielectric part of Bragg reflector 57, if any. For simplicity, in FIG. 4B, contact 50 is shown located between the confinement layer 59 and Bragg reflector 57, which would be the case if Bragg reflector 57 were entirely dielectric. VLSOA 40 may have a number of isolated electrical contacts 50 to allow for independent pumping within the amplifier. This is advantageous because VLSOA 40 is long in the longitudinal direction and independent pumping allows, for example, different voltages to be maintained at different points along the VLSOA. Alternately, the contacts 50 may be doped to have a finite resistance or may be separated by finite resistances, rather than electrically isolated.

Confinement structure 49 is formed by wet oxidizing the confinement layer 59. The confinement structure 49 has a lower index of refraction than aperture 55. Hence, the effective cross-sectional size of laser cavity 80 is determined in part by aperture 55. In other words, the confinement structure 49 provides lateral confinement of the optical mode of laser cavity 80. In this embodiment, the confinement structure 49 also has a lower conductivity than aperture 55. Thus, pump current injected through electrical contact 50 will be channeled through aperture 55 increasing the spatial overlap with optical signal 61. In other words, the confinement structure 49 also provides electrical confinement of the pump current.

Notice that in FIGS. 2A, and 4A and C, that the entire gain section of the optical transistor utilizes a linear gain along the whole length. Thus, if the optical transistor is used in analog mode, the linear gain leads to a high fidelity output (i.e. not distorted in any way) at the collector and emitter ports.

The output of the optical transistor may be coupled through reflectors, waveguides (including fibers), or diffractive optics (gratings, Fresnel lenses, etc.) that direct the vertical light back in the plane of the wafer. This in-plane light may be coupled to the input waveguide of the another optical transistor through directional couplers, grating assisted directional couplers, reflectors, diffractive optics, or bent or special waveguide structures.

The VLSOA 30 can also be used for other purposes besides amplification. For example, switching, inversion and wavelength conversion by using the 4 basic input and output ports. The fourth port is the electrical or pump injection for the optical transistor that could be either electrical or optically pumped.

The patent disclosure includes copyrightable material. The copyright owner gives permission for facsimile reproduction of material in Patent and Trademark Office patent files or records, but reserves all other copyright rights whatsoever.

The above embodiments are only illustrative of the principles of this invention and are not intended to limit the invention to the particular embodiments described. For example, although the optical transistor 20 is described as having a vertical cavity laser, one of ordinary skill in the art should recognize that another type of laser can be practiced without departing from the spirits in the present invention. Furthermore, the optical transistor 20 can be used as a basic building block in constructing other optical logic gates, such as an OR gate, an AND gate, a NOR gate, an NAND gate, and a flip—flip. The speed of the optical transistor 20 can be design to operate at hundreds of MHz or more. Verification can be done by measuring the input power, measuring the output power, and the isolation. Accordingly, various modifications, adaptations, and combinations of various features of the described embodiments can be practiced without departing from the scope of the invention as set forth in the appended claims.

What is claimed is:

1. An optical transistor, comprising:

an optical base port for receiving an input optical signal ($\lambda_B$);

an optical emitter port for generating an amplified replica ($\lambda_E$) of the input optical signal;

an optical collector port for generating an amplified inverted replica ($\lambda_C$) of the input optical signal;

a body coupled to the optical base port, the optical emitter port, the optical collector port, the body further comprising:

a bottom Distributed Bragg Reflector (DBR);

an active region overlaying the bottom DBR;

a top DBR overlaying the active region;

a substrate placed underneath the bottom DBR;

a bottom cladding layer overlaying the bottom DBR;

a top cladding layer disposed between the bottom DBR and the active region; and a confinement layer disposed between the top cladding layer and the top DBR.

2. The optical transistor of claim 1, wherein the optical collector port comprises an orthogonally polarized or wavelength shifted optical beam, the orthogonally polarized or wavelength shifted optical beam being collinearly propagated with an amplified signal generated from the optical signal ($\lambda_B$).

3. The optical transistor of claim 1, wherein the optical collector port is positioned in a plane on a wafer and is orthogonally or obliquely propagated relative to an amplified signal generated from the optical signal ($\lambda_B$).

4. The optical transistor of claim 1, wherein the input optical signal propagates horizontally through the active region to generate an amplified replica ($\lambda_E$).

5. The optical transistor of claim 4, wherein the input optical signal propagates horizontally through the active region and vertically through the top cladding layer, the confinement layer, and the top DBR, to generate the amplified inverted replica ($\lambda_C$).

6. A method for an optical transistor, comprising:

receiving an input light signal ($\lambda_B$) with stimulated emission; and responsive to the input light signal, generating a first amplified replica light output signal ($\lambda_E$); and responsive to the input light signal, generating a second inverted amplified replica light output signal ($\lambda_C$);

wherein the first amplified replica light output signal ($\lambda_E$) and the second inverted amplified replica light output signal ($\lambda_C$) share a ballast cavity.

7. The method of claim 6, further comprising:

injecting the input light signal ($\lambda_B$) that is orthogonal to the second inverted amplified replica light output signal ($\lambda_C$).

8. The method of claim 6, where the first amplified replica light output signal ($\lambda_E$) is linear or gain stabilized by either optical feedback of a laser, an injected optical signal, or pump or electrical modulation.

9. The method of claim 6, wherein the second inverted amplified replica light output signal ($\lambda_C$) is linear or gain stabilized by either optical feedback of a laser, an injected optical signal, or pump or electrical modulation.

10. The method of claim 6, wherein the input light signal ($\lambda_B$) comprises generates an unidirectional signal flow, thereby providing isolation between the input light signal ($\lambda_B$) and the second inverted amplified replica light output signal ($\lambda_C$).

11. An optical transistor, comprising:

an optical base port for receiving an optical signal ($\lambda_B$);

an optical emitter port for generating an amplified replica ($\lambda_E$) of the input optical signal;

an optical collector port for generating an amplified inverted replica ($\lambda_C$) of the input optical signal;

a body coupled to the optical base port, the optical emitter port, the optical collector port; and wherein the input optical sigal propagates horizontally through an active region of the body to generate the amplified replica ($\lambda_E$) and vertically through a top cladding layer, a confinement layer, and a top Distributed Bragg Reflector layer of the body, to generate the amplified inverted replica ($\lambda_C$).

* * * * *